United States Patent [19]

Sheng

[11] Patent Number: 5,354,381
[45] Date of Patent: Oct. 11, 1994

[54] PLASMA IMMERSION ION IMPLANTATION (PI³) APPARATUS

[75] Inventor: Terry T. Sheng, San Jose, Calif.

[73] Assignee: Varian Associates, Inc., Palo Alto, Calif.

[21] Appl. No.: 59,036

[22] Filed: May 7, 1993

[51] Int. Cl.⁵ .................... C23C 16/50; H01J 37/317
[52] U.S. Cl. ................. 118/723 E; 250/492.2
[58] Field of Search .............. 118/723 MW, 723 ME, 118/723 MR, 723 MA, 723 E, 723 ER; 250/251, 492.2

[56] References Cited

U.S. PATENT DOCUMENTS

| | | | |
|---|---|---|---|
| 4,384,918 | 5/1983 | Abe | 158/643 |
| 4,399,016 | 8/1983 | Tsukada et al. | 204/192 R |
| 4,463,255 | 7/1984 | Robertson et al. | 250/251 |
| 4,732,761 | 3/1988 | Machida et al. | 437/228 |
| 4,764,394 | 8/1988 | Conrad | 427/38 |
| 4,897,171 | 1/1990 | Ohmi | 204/298 |
| 4,925,542 | 5/1990 | Kidd | 204/298.05 X |
| 5,122,251 | 6/1992 | Campbell et al. | 204/298.06 |
| 5,136,171 | 8/1992 | Leung et al. | 250/251 X |

OTHER PUBLICATIONS

X. Y. Qian, et al, "Plasma Immersion Ion Implantation of SiF₄ and BF₃ for Sub-100 nm P+/N Junction Fabrication", Applied Phys. Lett. 59(3), pp. 348-350, Jul. 1991.

C. Pico, "Plasma Immersion Ion Implantation: A Cluster Compatible Technology", Solid State Technology, pp. 81-84, May 1992.

Article by X. Y. Qian, et al., entitled "Sub-100nm P+/N Junction Formation Using Plasma Immersion Ion Implantation", published in *Nuclear Instruments & Methods in Physics Research*, Section B (Beam Interactions with Materials and Atoms), vol. B55, No. 1-4, in Apr. 1991.

Article by Nathan W. Cheung, entitled "Plasma Immersion Ion Implantation for ULSI Processing", published in *VII. Trends & Applications*, in 1991, pp. 811-820.

Memorandum No. UCB/ERL M90/84 by X. Y. Qian, et al., entitled "Plasma Immersion Ion Implantation for VLSI Fabrication", published by College of Engineering, University of California, Berkeley, on Sep. 13, 1990.

Article by X. Y. Qian, et al., entitled "Conformal Implantation for Trench Doping with Plasma Immersion Ion Implantation", published in *Nuclear Instruments & Methods in Physics Research*, Section B (Beam Interactions with Materials and Atoms), vol. B55, No. 1-4, pp. 898-901, in Apr. 1991.

Article by X. Y. Qian, et al., entitled "Plasma Immersion Pd Ion Implantation Seeding Pattern Formation for Selective Electroless Cu Plating", published in *Nuclear Instruments & Methods in Physics Research*, Section B (Beam Interactions with materials and Atoms), vol. B55, No. 1-4, pp. 888-892, in Apr. 1991.

*Primary Examiner*—R. Bruce Breneman
*Assistant Examiner*—Jonathan D. Baskin
*Attorney, Agent, or Firm*—Gerald M. Fisher

[57] ABSTRACT

Implantation apparatus for cold cathode plasma immersion ion implantation (C²PI³) without a continuous plasma using very short high voltage, low duty cycle ionization pulses, in conjunction with a synchronously produced electron flow to neutralize positively charged wafer surfaces.

11 Claims, 9 Drawing Sheets

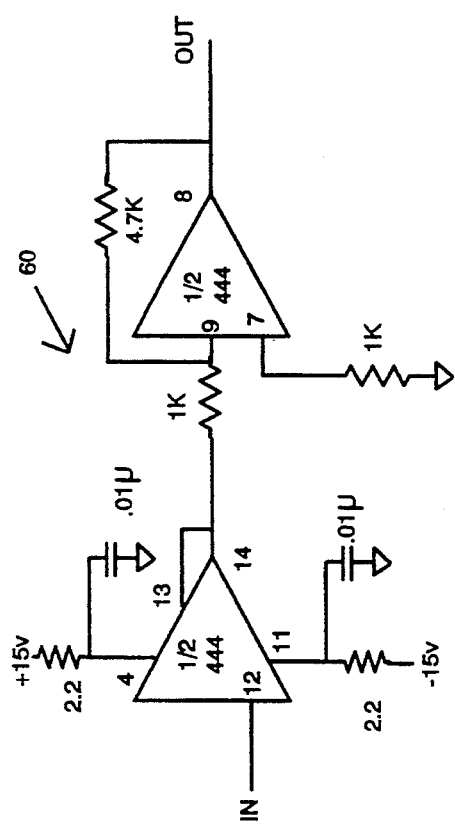
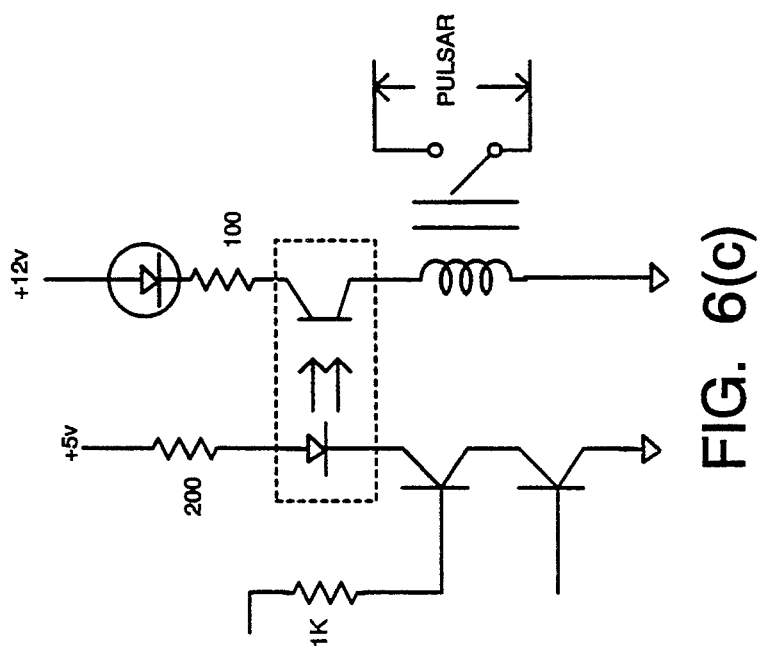
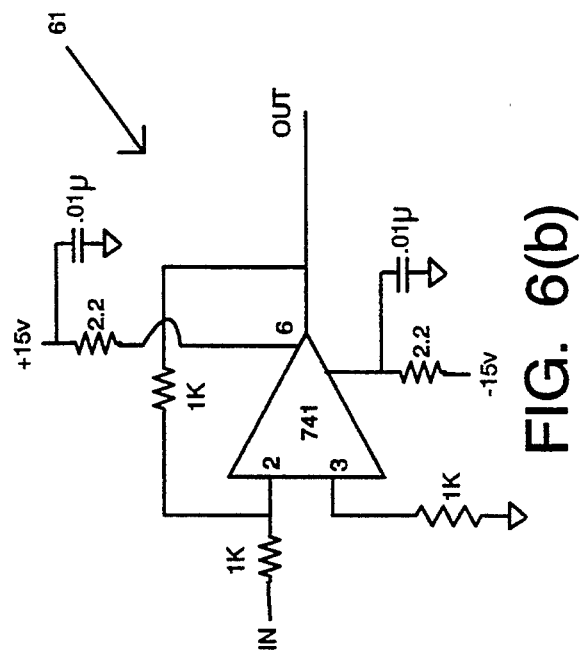
FIG. 6(a)
FIG. 6(b)
FIG. 6(c)

PLASMA IMMERSION ION IMPLANTATION (PI³) APPARATUS

FIELD OF THE INVENTION

This invention relates to apparatus for doping of semiconductor materials by ion implantation with particular application to shallow junction devices.

RELATED U.S. APPLICATION

This application relates to an earlier filed application, "Plasma Implantation Process and Equipment", Ser. No. 844,353, filed Mar. 3, 1992, now abandoned, assigned to the same assignee, which application is incorporated herein by reference. In addition, this invention relates to a simultaneously filed application, "Charge Monitor for High Potential Pulse Current Dose Measurement Apparatus and Method", inventors: T. Sherig, B. Cooper, S. Felch and C. E. Van Wagoner, Ser. No. 059,033.

BACKGROUND OF THE INVENTION

Modern electronic devices are based on semiconductor materials. A semiconductor has a crystalline structure in which very few electrons are mobile so that the intrinsic conductivity is too low to be useful as an electronic device. It is known to add small amounts of certain types of impurity to the crystal lattice to provide current carriers. The process of adding those impurities is known as "doping". The earliest technique for doping was accomplished by surrounding a semiconductor wafer with a gas comprising the dopants to be implanted and raising the temperature high enough to permit diffusion of the impurity atom into the lattice structure.

As the demand increased for more precise control over spatial uniformity and concentration of dopants, a device known as an ion implanter became the usual tool for adding the necessary impurity to a crystal. These implanters are large complex devices having very precise control of a dopant ion beam energy, position and scan rate. Very recently, for shallow junction formation, it has been recognized that the raster scan ion implanter has limitations at low energy beam conditions, under 10 KV, especially where dose and production rate, i.e. wafer throughput, requirements are high. Another method known as PI³ (Plasma Immersion Ion Implantation) is being studied because the dose rate is high at lower energy and the equipment is inexpensive. Prior PI³ methods employed a continuous plasma in the vacuum chamber.

In an earlier filed application, Ser. No. 844,353, dated Mar. 3, 1992, now abandoned, assigned to the same assignee, in which this inventor is a co-inventor, the PI³ concept is improved by use of variable duty cycle ion accelerating pulses in conjunction with a cylindrical target mounted on a plasma chamber wall. Although this earlier application was an improvement in shallow junction, low energy high current implantation, there are several problems with that approach. Even when the electrode behind the wafer was essentially completely shielded from ion bombardment, unintended impurities due to plasma etching were present in the chamber and were being implanted. Also, large particles were being formed in the plasma and on the wafer surface.

The object of this invention is to overcome the prior art PI³ contamination and particle problem and at the same time enable high yield manufacturing of shallow junction implantations without breakdown of any thin dielectric.

A secondary object is to provide inexpensive, high throughput apparatus for PI³ of a semiconductor, having adequate uniformity and implant dose control.

SUMMARY OF THE INVENTION

An apparatus for accomplishing PI³ using a pair of power supplies and very short ionization negative pulses applied to the primary cathode underlying the wafer in conjunction or followed by short ionization pulses applied to a second cathode which is facing toward the primary (wafer) electrode to provide neutralizing electrons.

The on-time and the duty cycle of the primary cathode ionization pulses arc made to be short enough so that no particles can grow in the $BF_3$ plasma. The neutralizing electrons necessary to protect the dielectric are provided by the secondary cathode.

BRIEF DESCRIPTION OF THE DRAWING

FIG. 6(a) is schematic of an illustrative amplifier of FIG. 6.

FIG. 6(b) is a schematic of another amplifier of FIG. 6.

FIG. 6(c) is a schematic of the high voltage pulse control circuit of FIG. 6.

DETAILED DESCRIPTION OF THE INVENTION

The prior art PI³ structures and methods of Conrad as described in U.S. Pat. No. 4,764,394 employ a so called hot cathode process which continuously maintains a plasma to generate positive ions and applies pulses of negative voltage to accelerate the ions toward the workpiece. The earlier PI³ work of Cheung et al at Berkeley and the work at the Varian labs also operated a continuous electron cyclotron resonance (ECR) produced plasma discharge in $BF_3$ gas and employed a highly negative pulse to the primary cathode behind the wafer to accelerate positive ions to the wafer. I have discovered that use of a continuously produced plasma causes: (1) significant concentrations of impurities to be etched from the chamber and to be implanted in the wafer; and (2) formation of large particles to be deposited on the wafer surface. Experiments show that a continuous $BF_3$ plasma discharge contains highly reactive species which etch the exposed surfaces in the chamber as well as the wafer. Also, the particles, of mostly silicon, grow continuously and deposit on the surface.

I have discovered that it is now possible to use a process known as a cold cathode discharge to obtain the desired implantation but to avoid both of these problems. The cold cathode process relies on secondary emission of electrons to ionize the gas. Specifically, without a continuous plasma in the chamber, by using a highly negative pulse, a plasma will be created which is only in place when the pulse is on.

For a six inch wafer, I prefer a primary pulse on the order of 10 microseconds with a low duty cycle, i.e. 1%. However, so long as the primary pulse width is less than the order of 15 milliseconds, I have determined that no significant particle formation occurs. Shorter pulses will provide the benefits of my invention for smaller diameter wafers. For a continuous plasma, after 15 milliseconds, the particles seem to reach a critical diameter and they form and deposit on the surface in great concentrations.

I also employ a very short high voltage pulse to a second cold cathode for electron source to produce neutralizing electrons which flow to the workpiece to prevent oxide breakdowns.

Figure 1:
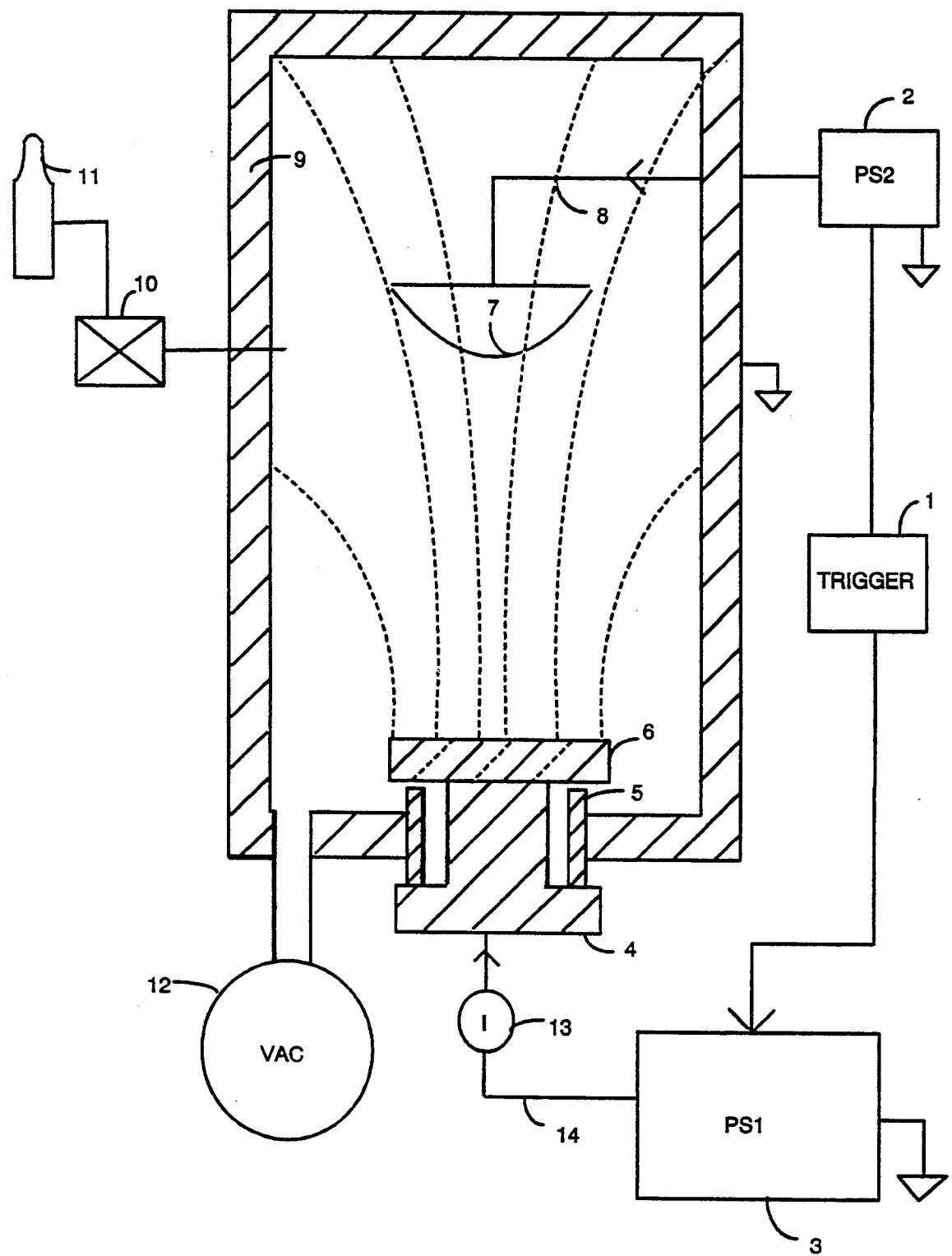
FIG. 1 is a block diagram schematic of the inventive PI³ system.

With reference to FIG. 1, a chamber 9 of aluminum ahoy is evacuated by a pump 12 to pressures on the order of 1 m Torr, while $BF_3$ is introduced into the chamber via mass flow controller 10 from bottle 11. A wafer 6 is mounted to an electrode 4 in a wall of chamber 9 which electrode is shielded electrically by annular cylindrical walls 5 which are electrically connected to the chamber wall 9. PS1, the high voltage power supply 3 for providing a pulse on order of negative 5 KV is connected to the electrode 4 via conductor 14. A current sensor 13 is in the line 14. In the chamber, an electron source 7 is shown centrally located with respect to the electrode 4 but removed from the electrode 4 to provide a uniform flow of electrons to the wafer which is responsive to a large negative pulse applied to the cathode 7 from the second power supply PS2, i.e. on the order of negative 2 KV. The two power supplies PS1 and PS2 are each timed in respect to a single trigger source so that they can have their pulses precisely synchronized.

Since there is no pre-ionization of the gas, the pulsed negative voltage applied to the electrode 4 on the order of 5 KV, creates electric fields lines which travel from the face of the electrode 4 to the uniform potential chamber wall. These lines are controlled by the geometry of the housing.

Since electrons are lighter and very mobile, and since the field lines all focus down to the face of electrode 4, the electrons in close proximity to the wafer 6 start stripping from the gas upon application of the pulse. This leaves the more slow moving positive ions so formed in the region. These ions are then accelerated and implanted into the wafer. The uniformity of dose implant is on the order of 2% over a 6 inch wafer for 1 sigma distribution.

The short duration ionization pulses do not completely eliminate chamber wall etching so that impurities do form but only during the pulse on-time.

It has been determined that many of the larger particles which had formed using continuous ionization are negatively charged. By using a small negative bias from Bias Supply 15, it is possible to deflect those negatively charged ions from reaching the wafer.

Figure 3:
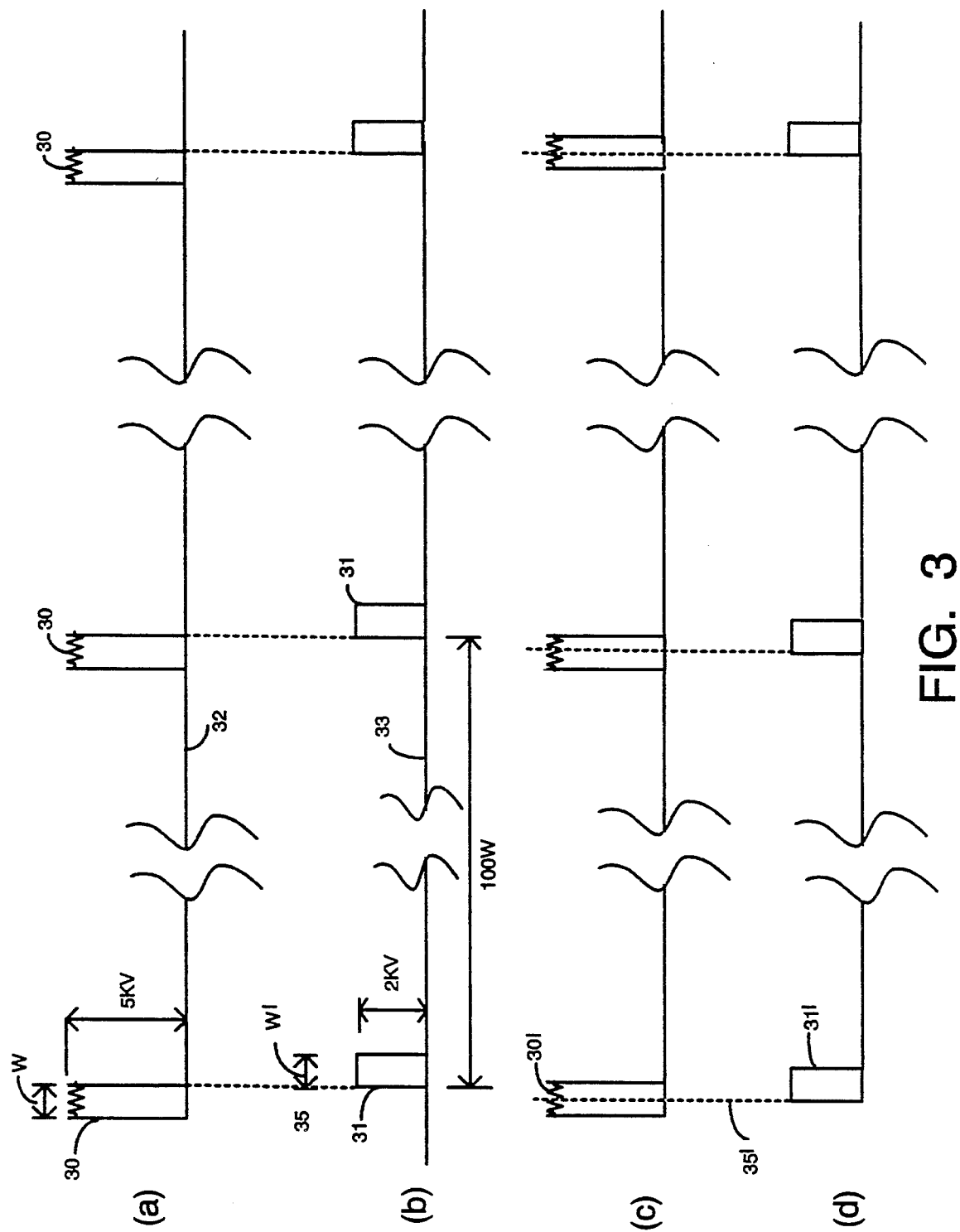
FIG. 3(a)–3(d) are timing diagrams, with FIG. 3(a) and 3(b) illustrative of the preferred relationship of the anode pulse and the cathode pulse.

With reference to FIG. 3(a) and FIG. 3(b), the voltage pulses 30 from PS1 are shown followed immediately by a voltage pulse train 31 from PS2. The pulse width W of the pulse train 30 is preferably 1–30 microseconds and the pulse period is on the order of 100 W. The pulse width W' of the PS1 pulse is on the same order. Both pulses 30 and 31, are shown in positive format for convenience of illustration. The best manufactured yield from the standpoint of repeatable percentage of good devices/total devices has been obtained when the pulse 31 follows immediately after pulse 30 ends. However, as shown in FIG. 3(c) and 3(d), pulses 30' and 31' can overlap in time so that the electrons are neutralizing the dielectric simultaneous with the ion implant. For reasons which are not understood, although some of the benefits of the invention are obtained, the yield of acceptable devices is not as high or as repeatable with such overlapping pulses.

The cold cathode 7 has been selected of a non-contaminating material or is clad with such a material. I prefer high purity amorphous carbon, although Ni is also acceptable because it is inert in fluorine plasma. The geometry of the electrode 7 surface is also important. Efficiency of electron emission by methods of surface roughening has been found useful for increasing the electron flooding density. A generally concave outer surface provides more surface area than a planar device and may be preferred for providing more uniform field lines at the wafer surface.

After anneal of an implanted wafer, we have demonstrated sheet resistance of 130 to 1K ohms/square, preferably of 150 ohms/square and a junction depth of about 900 Å. Also the particle count is less than 1 particle/$cm^2$ in a non-clean room environment (0.3→2.5 $\mu m$ particle diameter). For comparison, the particles count for the $BF_3$ECR process was several orders of magnitude higher.

Figure 2:
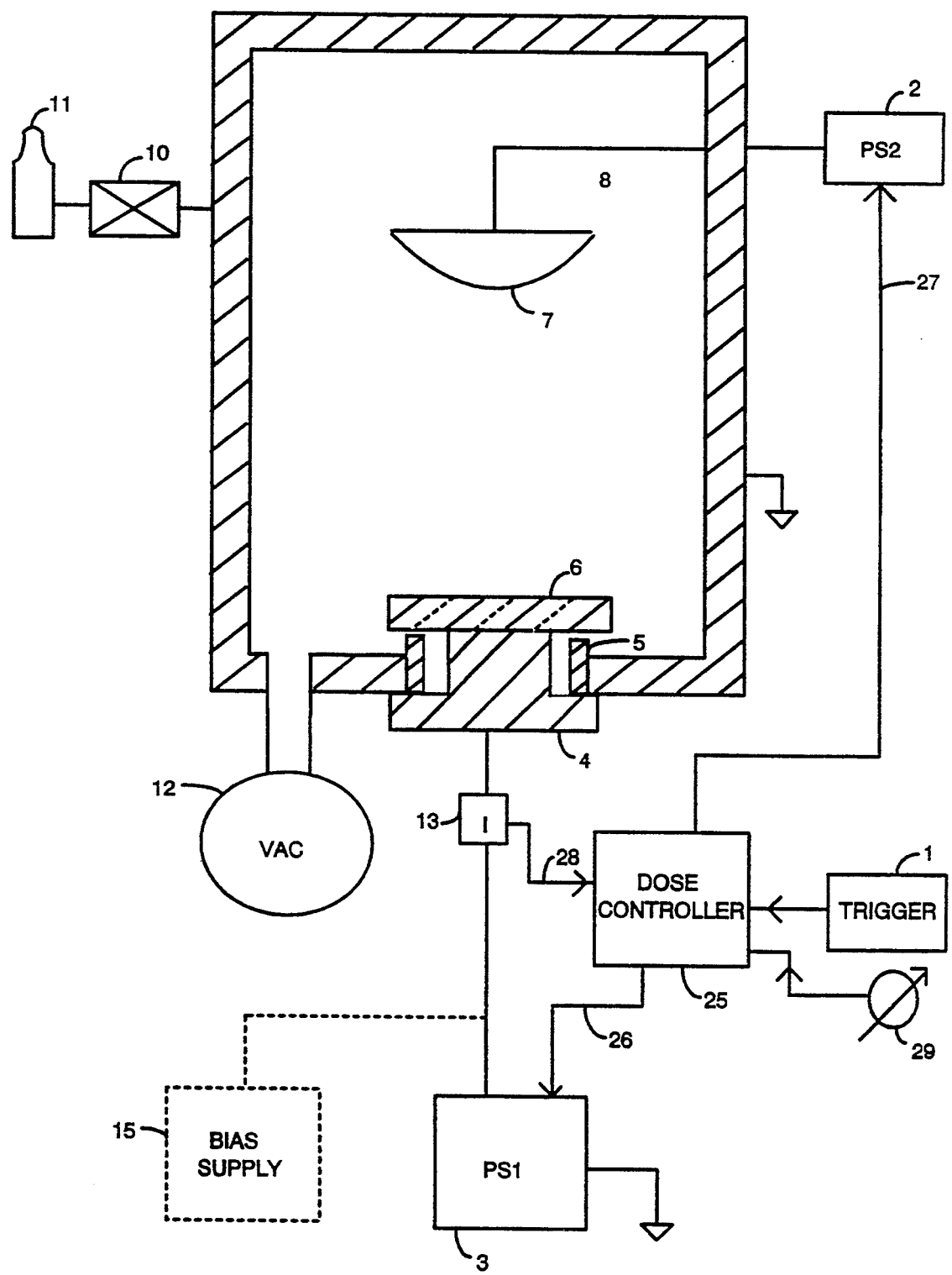
FIG. 2 is a more detailed block diagram of the inventive PI³ system including an automatic dose controller

With reference to FIG. 2, I show the current sensor 13 being connected to a dose controller 25. In this embodiment, the dose controller, responsive to a dose selection 29, can measure the progress during implantation and shut down the power supplies 2 and 3 when the desired dose is achieved.

Since PS1 and PS2 are inductive power supplies, it is impossible to turn off the pulse current instantly. This complicates the ability of the dose controller to determine the ion dose which has been implanted. So long as the ion implantation voltage pulse is less than 10 KV, secondary electrons produced at the wafer surface of silicon are less than 3%. Accordingly, with PS1 turned off, the current pulse waveform measured by sensor 13 is of the form illustrated in FIG. 4(a). This waveform comprises a region 41 in which current indicates positive ion flow to the surface of the wafer 6 in response to the pulses from PS2. Also seen in FIG. 4(a) waveform is a region 42 in which a current is indicated which is due to the inability of the current to instantaneously stop due to the flux linkages from the inductively produced current from the power supply. In order to measure the dose of the positive ions, it is necessary to eliminate the portion 42 of the waveform 40 which is not due to the positive ion current. With this goal in mind, applicant has provided a circuit to convert the sensed current waveform 40 into a waveform 44 which tracks the rise and fall time of the pulse 41 but completely eliminates the opposite polarity portion 42 as seen in the region 43. Having produced the waveform 44, it is now possible to integrate each pulse 36 to reach a measure of the total ion implantation, i.e. dose as a function of time.

Figure 5:
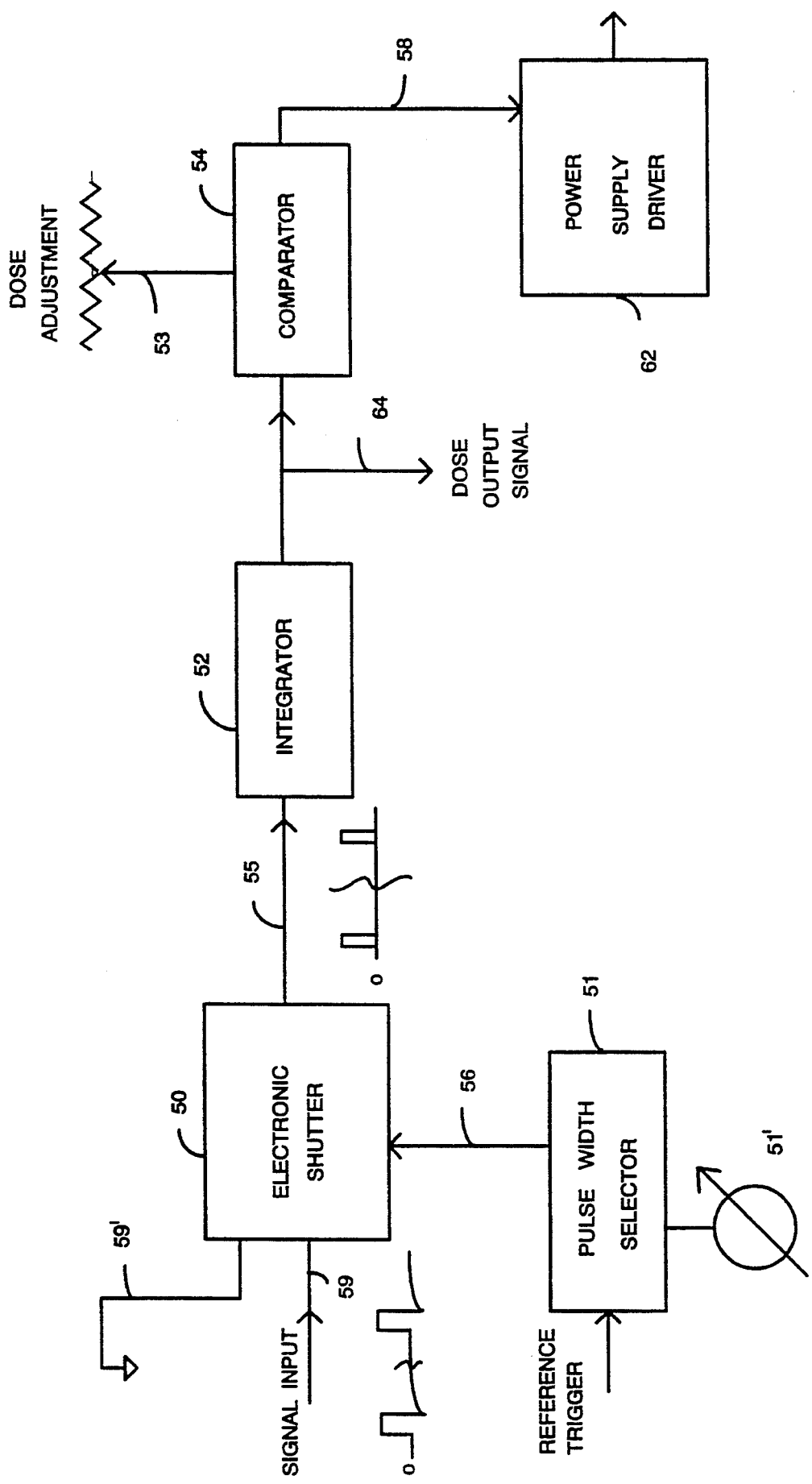
FIG. 5 is a block schematic diagram of the dose controller.

The block diagram of FIG. 5 is illustrative of the dose control circuit elements. The input 59 is a current waveform having two polarities with respect to ground. The signal 59 is received by an electronic shutter 50.

Also connected to the electronic shutter is a pulse width selector 51 which has a manual pulse width adjuster 51. Connected to the pulse width selector 51 is a Reference Trigger from Trigger Generator 1. There are many different circuits which can accomplish the desired pulse shutter function. The circuit described below is one alternative but many other circuits are possible.

Figure 4:
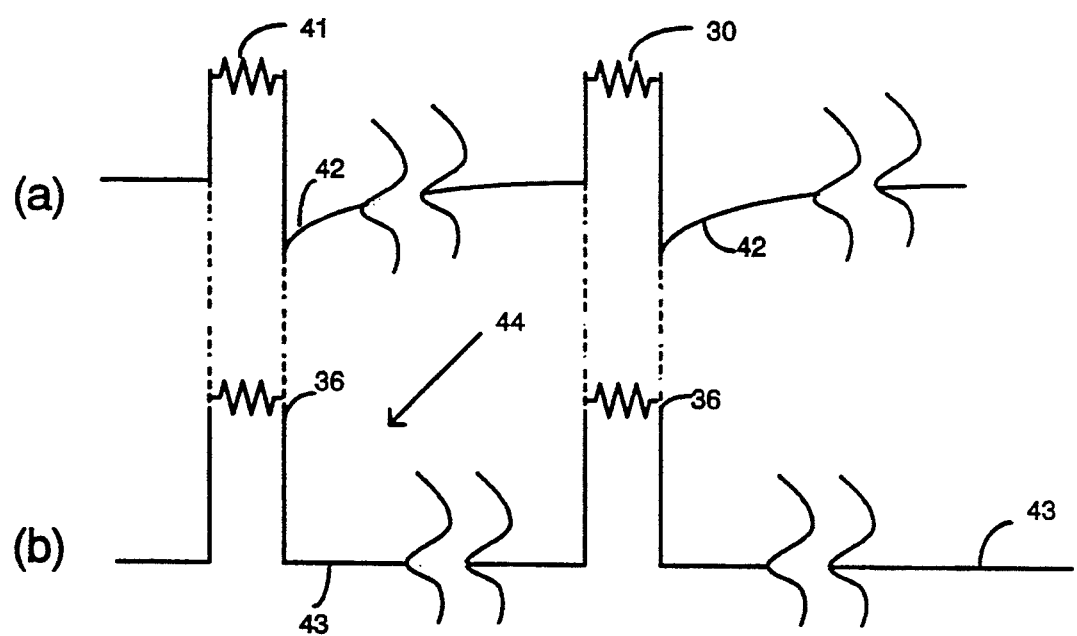
FIG. 4(a) is illustrative of the current measured in a series current sensor in the anode circuit.
FIG. 4(b) is the anode current after deletion of the negative portion in FIG. 4(a).

When the pulse width from pulse width selector 51 is exactly the same width as the positive portion 41 of FIG. 4(a), the output of the shutter 50 will switch to ground and have the negative portion 42 removed and the signal 55 into the integrator 52 will be as shown in FIG. 4(b). The output 64 of the integrator 52 is available as an indicator of the dose and is provided to the comparator 54. The comparator 54 accepts selection adjustment 53 to establish a stable voltage dose adjustment as a reference level. When the analogue integrated voltage 64 exceeds the reference 53, the comparator 58 sends a signal 58 to turn off the power supply 3 and end the implantation of the workpiece.

Figure 6:
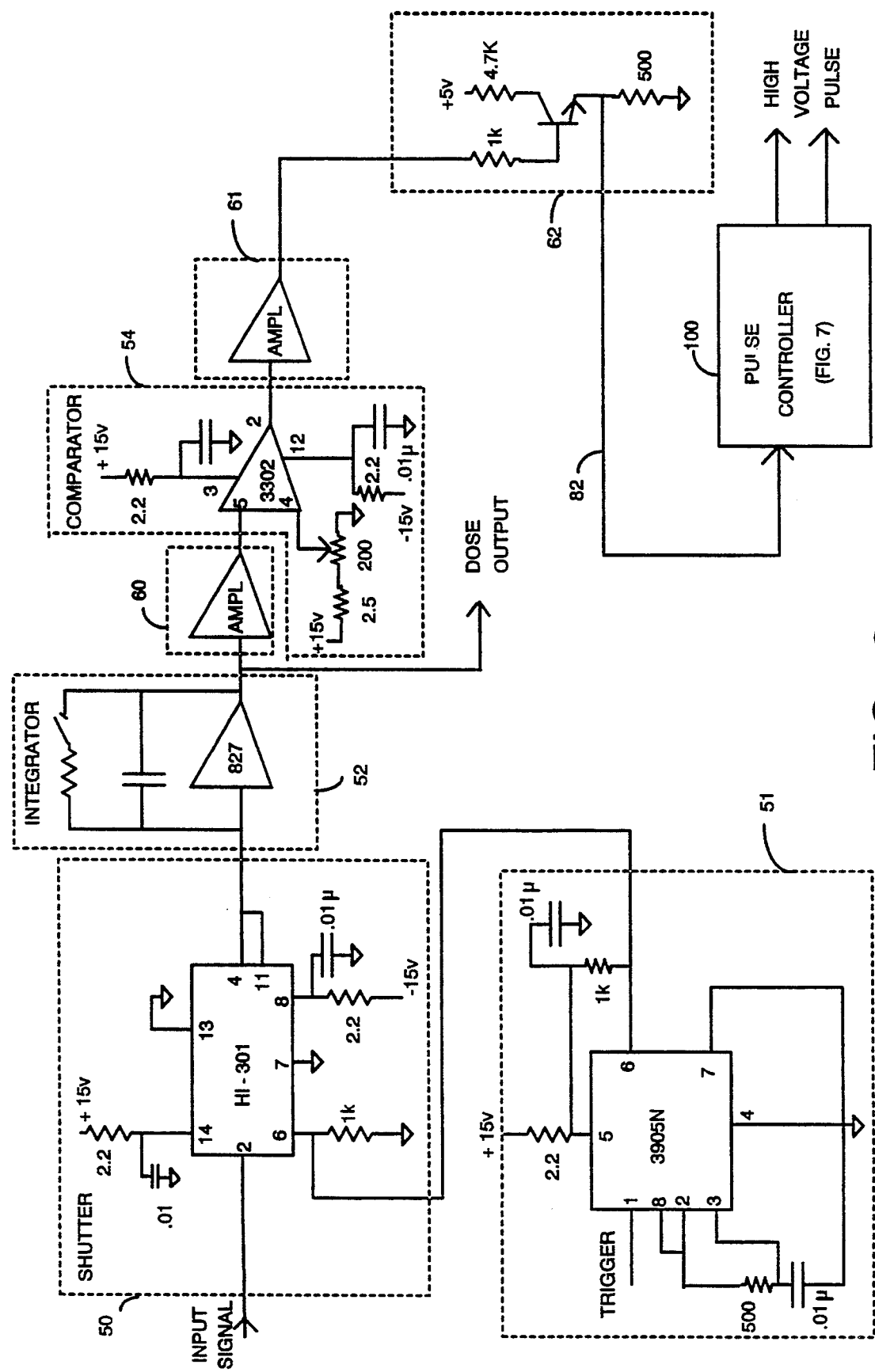
FIG. 6 is schematic diagram of a preferred dose controller.

With reference to FIG. 6, circuits are shown in detail which can carry out the functions of the block diagram of FIG. 5. The trigger circuit 51 is based on a 3905N chip manufactured by National Semiconductor Corporation. The adjustable 500 ohm resistor connected between pins 2 and 3 is a 30 turn precision resistor. This circuit is a timer circuit in which the RC time constant determines the on time. Other circuits such as standard one-shot multivibrator circuits would satisfy this requirement.

The pulse out on pin 6 of the 3905N chip is connected to pin 6 of the HI-301 chip made by Harris Corporation. The HI-301 is a very fast switch circuit which passes the input signal on pin 2 to the output pin 4 as long as the pin 6 input is high and when pin 6 goes low, the pin 4 output goes to the signal on pin 7 which is grounded. Using an oscilloscope to manually adjust the "on time" of timer 51, we have adjusted the shutter switching time very easily within 1.0 microseconds of the pulse off time of pulser voltage.

Figure 6D:
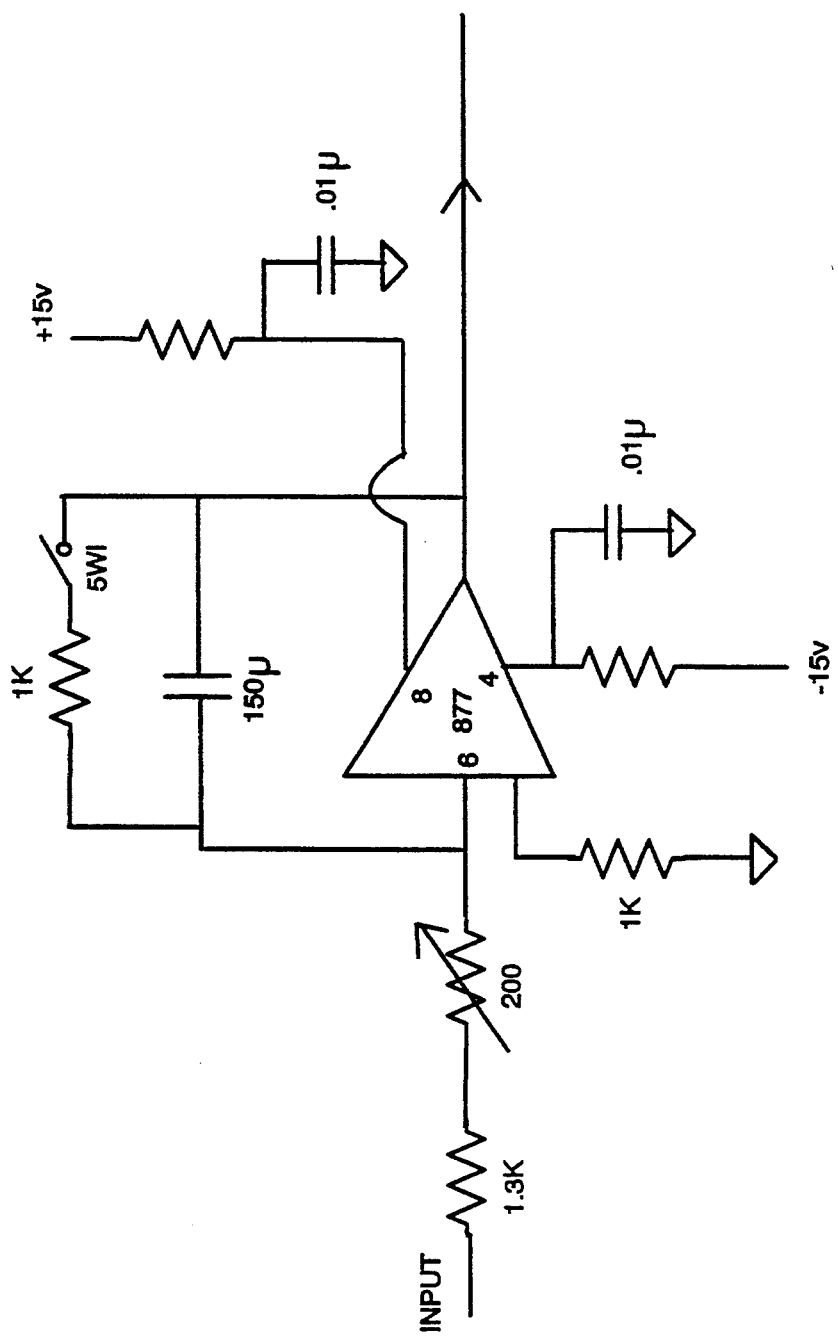
FIG. 6(d) is the schematic of the integrator circuit of FIG. 6.

The output from pin 4 of HI-301 is connected to an integrator circuit 52 connected around an OP-AMP 827 made by Analog Devices. A manual switch SWI is connected in the feedback to provide a selection of time constants. The integrator is more fully depicted in FIG. 6(d).

Figure 7:
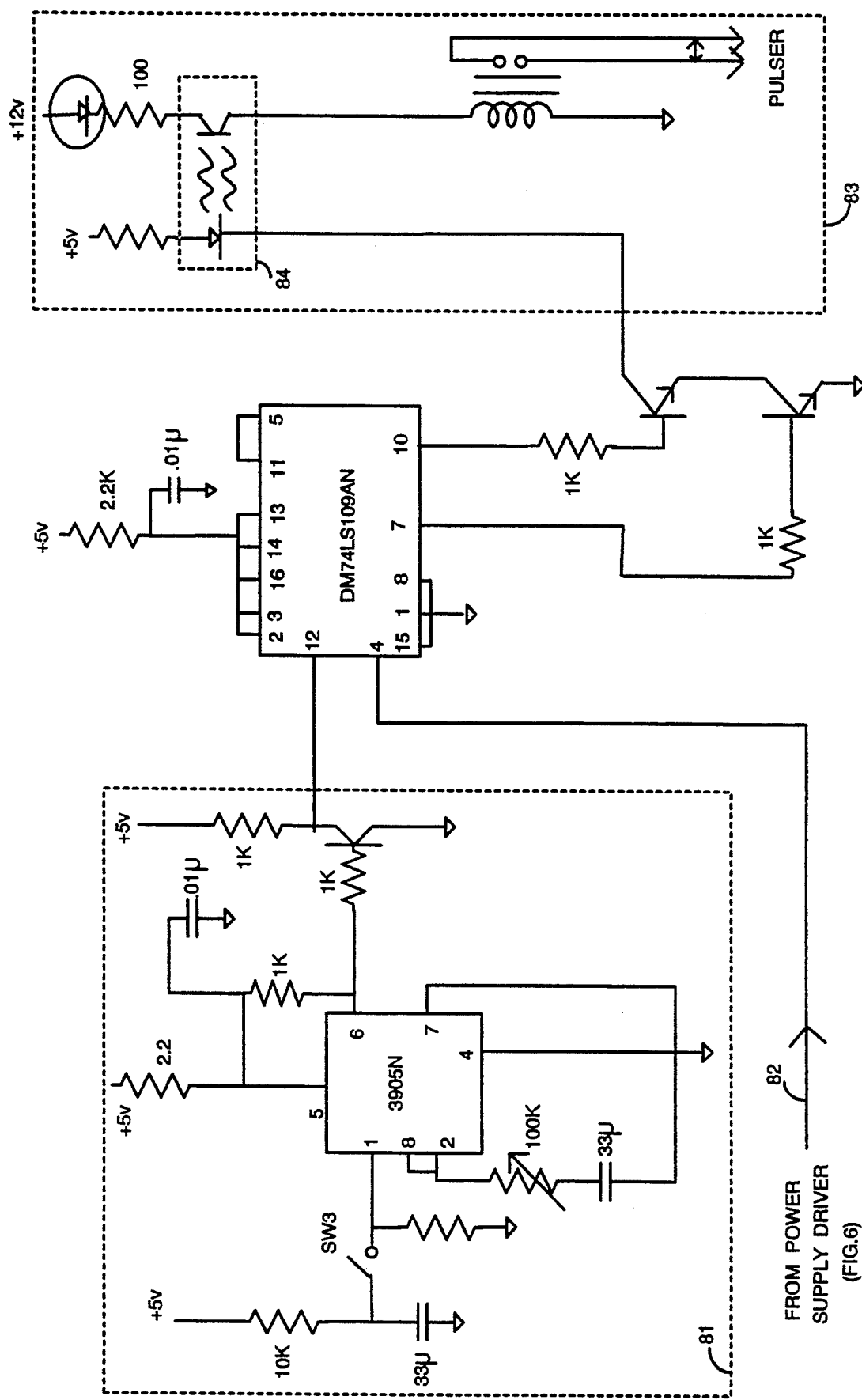
FIG. 7 is a schematic of the pulser control circuit of FIG. 6.

Amplifier 60 is more fully described in FIG. 6(a) and is a voltage follower on a single 444 chip made by National Semiconductor Corporation. The amplifier output of circuit 60 is connected to the comparator circuit 54. Comparator circuit 54 provides an output on pin 2 of the 3302 chip made by Motorola which switches between 5 V and ground depending on the level of the two inputs pins 5 and 4. Since the voltage at pin 4 is selectable by adjusting the 200 ohm potential divider connected to pin 4, the user is able to adjust the dose level at which the comparator output switches. The comparator 54 output is connected to a voltage follower 61 which can drive any control circuit to shut down the high voltage pulse generator in desired sequence. An example is the power supply driver circuit 62 more fully described in FIG. 6(b). The power supply driver 62 is connected to pulse controller 100 which is more fully described in FIG. 7. A timer 81 is connected to a DM74L5109AN chip made by National Semiconductor Corporation for driving the Pulse Generator 83 through the opto isolator 84. Pulse Generator 83 is Model 350 made by Velonix Inc., San Diego, Calif.

It is understood that the present invention is not limited to the particular embodiments set forth herein but embraces all such modified forms which come with the scope of the following claims.

What is claimed is:

1. In a non-raster scan implantation apparatus comprising,
    a vacuum chamber, said chamber having walls, one said wall having mounted therein an electrode, said electrode having at least one planar surface to support a wafer thereon for implantation of positive ions into said wafer;
    an electron source for neutralizing a positive charge on said wafer, said electron source being mounted in said chamber for providing a large cross sectional area flow of electrons toward said planar surface of said electrode;
    means to provide a source of ionizable gas to said chamber, said gas containing a desired dopant for implantation into said wafer;
    means for providing a first and second high voltage pulse, said first high voltage pulse being connected between said electrode and said chamber for creating a cold cathode ionizing field to produce positive ions from said ionizable gas of said dopant and for accelerating said dopant toward said electrode, and wherein said second high voltage pulse is connected between said electron source and said chamber for providing electrons from said electron source in response to said second pulse; and
    synchronizing trigger means, said synchronizing trigger means being connected to said means for providing said first and second high voltage pulse for permitting a synchronizing relationship between said first and second high voltage pulses.

2. The apparatus of claim 1 including electrode current sensing means, said electrode current sensing means being connected between said electrode and means for providing said first and second high voltage pulse for providing an output signal indicative of said electrode current responsive to implantation ion charge flow to the wafer responsive to said first high voltage pulse.

3. The apparatus of claim 2 including
    a dose controller, said dose controller being connected to said output signal of said electrode current sensing means and to said synchronizing trigger means, said dose controller includes means to calculate the time integral of said implantation ion charge flow to determine a signal representative of the dose of dopant implanted into said wafer.

4. The apparatus of claim 3 wherein said dose controller includes means to compare said signal representative of said dose to an operator selected dose endpoint signal; and
    means to discontinue pulsing by said means for providing first and second high voltage pulses in response to said comparison when said dose endpoint is attained.

5. The apparatus of claim 1 wherein said electron source is an electrically conducting material which is chemically inert to plasma species.

6. The apparatus of claim 1 wherein said electron source consists of amorphous carbon material, or pure carbon.

7. The apparatus of claim 1 wherein said electron source consists of Ni or Ni clad material.

8. The apparatus of claim 1 wherein said electron source has a roughened surface to improve the electron emission efficiency.

9. The apparatus of claim 8 wherein said roughening includes providing fine emission tips on said surface.

10. The apparatus of claim 1 wherein said electrode is further connected to a low voltage negative bias voltage supply for deflecting negatively charged low velocity particles from reaching said wafer.

11. The apparatus of claim 1 wherein said means for providing a first and second high voltage pulse comprises a first power supply and a second power supply.

* * * * *